United States Patent [19]

Kieda et al.

[11] Patent Number: 5,021,924
[45] Date of Patent: Jun. 4, 1991

[54] SEMICONDUCTOR COOLING DEVICE

[75] Inventors: Shigekazu Kieda, Ishioka; Tadakatsu Nakajima, Ibaraki; Heikichi Kuwahara, Ibaraki; Motohiro Sato, Ibaraki, all of Japan

[73] Assignee: Hitachi, Ltd., Tokyo, Japan

[21] Appl. No.: 407,159

[22] Filed: Sep. 14, 1989

[30] Foreign Application Priority Data

Sep. 19, 1988 [JP] Japan ................. 62-232463

[51] Int. Cl.[5] .............................................. H05K 7/20
[52] U.S. Cl. .................. 361/385; 165/104.33; 165/908; 361/384
[58] Field of Search ............... 165/80.3, 80.4, 104.33, 165/104.34, 908; 62/414, 418; 174/16.3, 15.1, 252; 357/82; 361/382-386, 395

[56] References Cited

U.S. PATENT DOCUMENTS

| | | | |
|---|---|---|---|
| 3,298,195 | 1/1967 | Raskhodoff | 62/414 |
| 3,524,497 | 8/1970 | Chu | 174/15.1 |
| 3,843,910 | 10/1974 | Ringuet | 165/908 |
| 4,158,875 | 6/1979 | Tajima | 361/385 |
| 4,315,300 | 2/1982 | Parmerlee | 165/80.4 |
| 4,399,484 | 8/1983 | Mayer | 165/908 |
| 4,485,429 | 11/1984 | Mittal | 165/104.33 |
| 4,838,041 | 6/1989 | Bellows | 361/383 |
| 4,851,965 | 7/1989 | Gabuzda | 165/908 |

OTHER PUBLICATIONS

"Silicon Heat Sink . . . Temperatures", Ahearn, IBM Tech. Discl. Bul., vol. 21, No. 8, Jan. 79, pp. 3378–3380.

Primary Examiner—Gerald P. Tolin
Attorney, Agent, or Firm—Antonelli, Terry, Stout & Kraus

[57] ABSTRACT

A multi-chip module or a like device having a sealed structure for being cooled with a liquid cooling medium, and in which the semiconductor integrated circuit chips or the chip carriers mounting the chips are individually cooled with the forced convection cooling using a cooling liquid. The cooling liquid injection ports are so arranged that the cooling liquid flows substantially in parallel with the back surfaces of the chips.

21 Claims, 8 Drawing Sheets

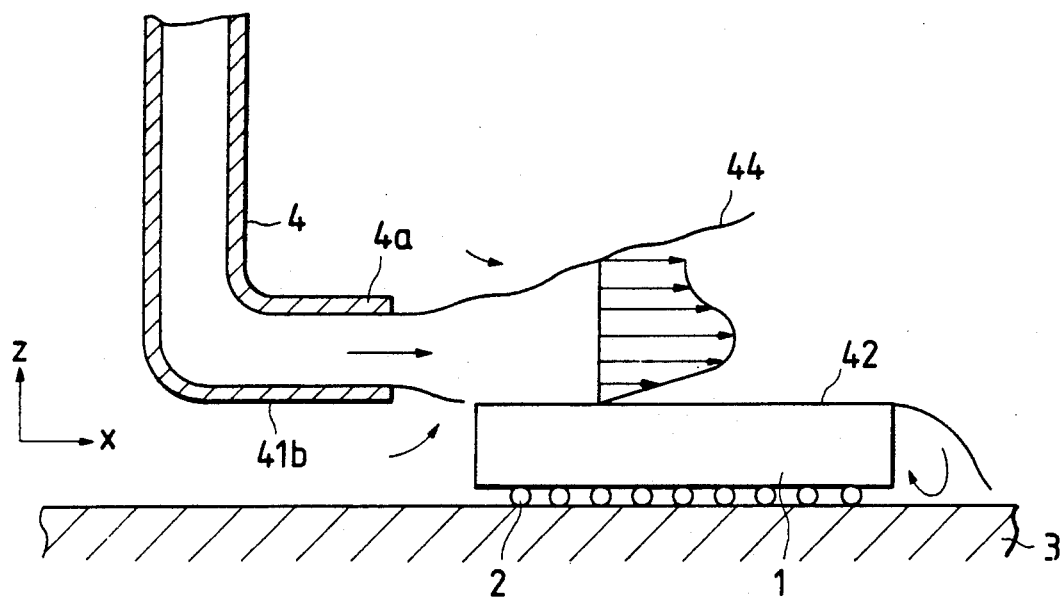
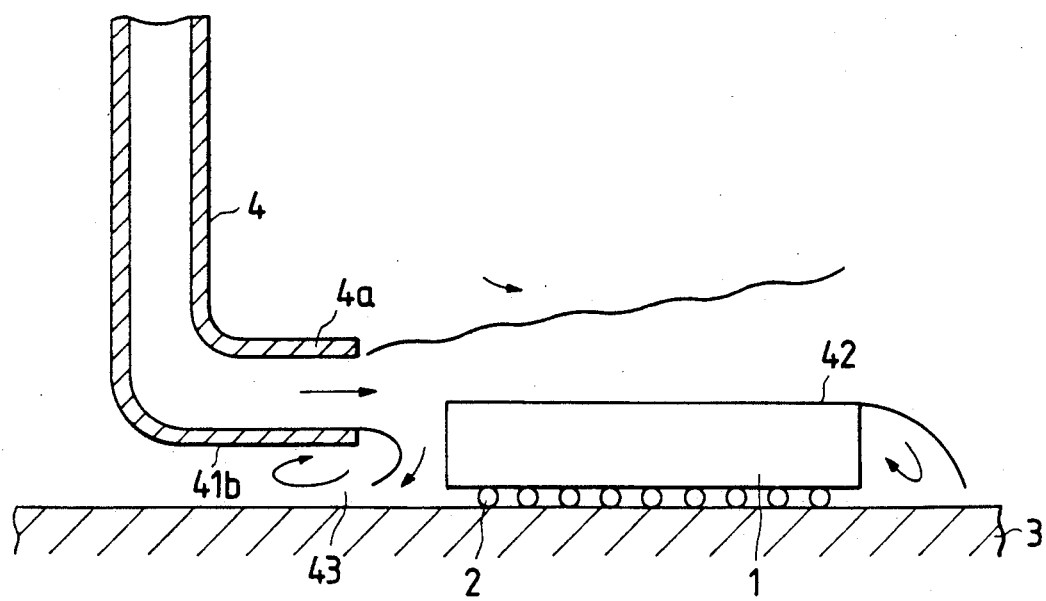

SEMICONDUCTOR COOLING DEVICE

BACKGROUND OF THE INVENTION

The present invention relates to a device for cooling semiconductors such as multi-chip modules mounting chips that generate large amounts of heat used for a large computer, and to a method of fabricating the same.

Various means have heretofore been studied for removing large amounts of heat generated from the circuits accompanying the development in the technology for highly densely packaging the integrated circuits on a substrate. In recent years, in particular, studies have been conducted concerning a thermal conduction liquid cooling which couples the heat generating portion to the cooling liquid through a thermal conduction path using a thermal conduction device in place of the conventional forced air cooling, and concerning a direct cooling by which the whole circuit is immersed in the coolant, in order to cool the integrated circuits that consume large amounts of electric power. The former system has been disclosed in, for example, Japanese Patent Laid-Open No. 53547/1977. According to this cooling device, however, a large heat resistance develops between a chip and a piston, and between the piston and a housing.

According to U.S. Pat. No. 3,649,738 or Japanese Patent Laid-Open No. 44479/1979 furthermore, a system is disclosed in which a path through which a cooling fluid flows is provided in a cold plate that has a flexible surface such as bellows, and the cold plate that is cooled is brought into direct contact with the chip. Even according to this system, a large heat resistance develops on the contact surface between the chip and the cold plate imposing limitation on the ability for removing the heat generated by the chip, and making it difficult to adjust the cooling performance depending upon the amounts of heat generated by the individual chips.

In contrast with the above conduction cooling, a direct immersion cooling is disclosed in Japanese Patent Laid-Open No. 134451/1985, wherein finned chips mounted on a substrate are cooled by the forced convection of liquid that flows through the module. According to this system, the cooling can be affected efficiently owing to the forced convection. When the chips are arranged in line in a direction in which the cooling liquid flows, however, the temperature of the cooling liquid rises as it flows making it difficult to maintain the chips at a uniform temperature. When the chips are arrayed in a staggered manner, the packaging density decreases, the wiring length increases in the substrate for connecting the chips, and the signal processing speed becomes slow.

According to this cooling system in which the whole module is cooled, furthermore, no provision is made for allowing a change in the flow for each of the chips to change the cooling characteristics.

The above-mentioned U.S. Pat. No. 3,649,738 or U.S. Pat. No. 4,277,816 discloses a cooling method using an impinging jet. In the impinging jet, the heat transfer coefficient is the highest at the central position of impinging of jet and decreases rapidly toward the radial direction thereof as has been disclosed in, for example, Japan Society of Mechanical Engineers "JSME Data Book : Heat Transfer", 3rd Edition, February, 1975, p. 110. This means that when the chip is to be cooled using the impinging jet, the temperature becomes lower at the center of the chip than at the periphery, and noise generates due to a temperature difference in the chip.

A system for individually cooling the chips by the forced convection boiling using a liquid jet has been shown in FIG. 5 of Computers in Mechanical Engineering, Springer-Verlag, Vol. 6, No. 6, P. 18, 1988. This system is capable of removing a high heat flux. However, when the chips generate the heat in different amounts and when the heat must be removed in different amounts for each of the chips, it becomes necessary to change the flow rate, flow velocity and temperature of jet for each of the chips to uniformalize the temperature. Therefore, the same problems remain as those mentioned with reference to the above U.S. Pat. No. 3,649,738 or Japanese Patent Laid-Open No. 44479/1979.

SUMMARY OF THE INVENTION

The object of the present invention is to efficiently cool the semiconductor integrated circuits in a semiconductor device in which a plurality of semiconductor integrated circuits that consume large amounts electric power are mounted on a substrate.

Another object of the present invention is to uniformalize the temperature of the chips mounted on the substrate and to uniformalize the temperature in the same chip.

A further object of the present invention is to decrease the liquid force that acts on the solder bumps that connect the chips to the substrate and to decrease the liquid force that acts on the jumper wires on the module substrate.

In order to achieve the above objects, the present invention effects the forced convection cooling using a cooling liquid directly for the individual semiconductor integrated circuit chips or the chip carriers mounting the chips in a multichip module or the like that has a sealing structure for being cooled with a liquid cooling medium. In this case, cooling liquid feeding means is so arranged that a flow direction of the liquid becomes substantially in parallel with the back surface of the chip, in order to suppress nonuniformity in the temperature distribution in the chip that developed in the conventional impinging jet system, as well as to decrease the load exerted on the solder bumps for connection. Moreover, the flow of cooling liquid is concentrated near the chips in order to decrease the liquid force that acts upon the jumper wires on the module substrate.

In order to improve the cooling efficiency, furthermore, the present invention employs a heat transfer enhancement plate such as fins, and further changes the size and shape of the heat transfer enhancement plate in order to vary the cooling performance is dependence upon the amounts of heat generated by the chips and to uniformalize the chip temperatures in the module.

Furthermore, the feature of the fabrication method of the present invention resides in that liquid supplying means which directly injects liquid onto each of the chips to cool them by forced convection, the header for distributing the cooling liquid to the liquid supplying means, and the cap for sealing the module mounting a plurality of integrated circuits for immersion cooling the chips, are fabricated as a unitary structure in the form of a cap, and then the cap is connected onto the module substrate that mounts the integrated circuits.

Another feature of the present invention resides in a device for cooling semiconductors comprising a plurality of semiconductor integrated circuits mounted on a substrate, a sealing member for sealing said plurality of integrated circuits, and liquid supplying means that is provided in the sealing member and that has cooling liquid injection ports for each of the integrated circuits, wherein said liquid injection ports inject the cooling liquid in parallel with or at least a slant to the back surfaces of each of the integrated circuits.

A further feature of the present invention resides in a device for cooling semiconductors comprising a plurality of semiconductor integrated circuits mounted on a substrate, a sealing member for sealing the plurality of integrated circuits, cooling liquid supplying means that is provided in the sealing member and that has cooling liquid injection ports for each of the integrated circuits. A cooling liquid introducing path that is provided in the sealing member and introduces the cooling liquid to be supplied to the integrated circuits, with a cooling liquid discharge path being provided independently from the cooling liquid introducing path and guiding the cooling liquid after having cooled the integrated circuits to outside of the sealing member.

Still further feature of the present invention resides in a device for cooling semiconductors comprising a plurality of semiconductor integrated circuits mounted on a module substrate, a module sealing cap for sealing the plurality of integrated circuits, a header formed in the cap to guide the cooling liquid, cooling liquid supplying means for directly injecting the cooling liquid guided into the header to each of the integrated circuits, and a cooling liquid discharge port for discharging the cooling liquid to the external side after it is injected into said cap to cool the integrated circuits. The cooling liquid supplying means has liquid injection ports for injecting the cooling liquid in parallel with the back surface of each of the integrated circuits.

Yet further feature of the present invention resides in a method of cooling semiconductors wherein a plurality of semiconductor integrated circuits are formed and mounted on a substrate, with cooling liquid being injected in parallel with the back surface of each of the integrated circuits, and with the cooling liquid being brought into direct contact with the integrated circuits to cool them.

Other features, objects and advantages of the present invention will become obvious from the following description in conjunction with the accompanying drawings.

BRIEF DESCRIPTION OF THE DRAWINGS

FIG. 4 is a section view of liquid supplying means shown in FIG. 1;

FIG. 5 is a section view of when the liquid supplying means is installed improperly;

DESCRIPTION OF THE PREFERRED EMBODIMENTS

Figure 1:
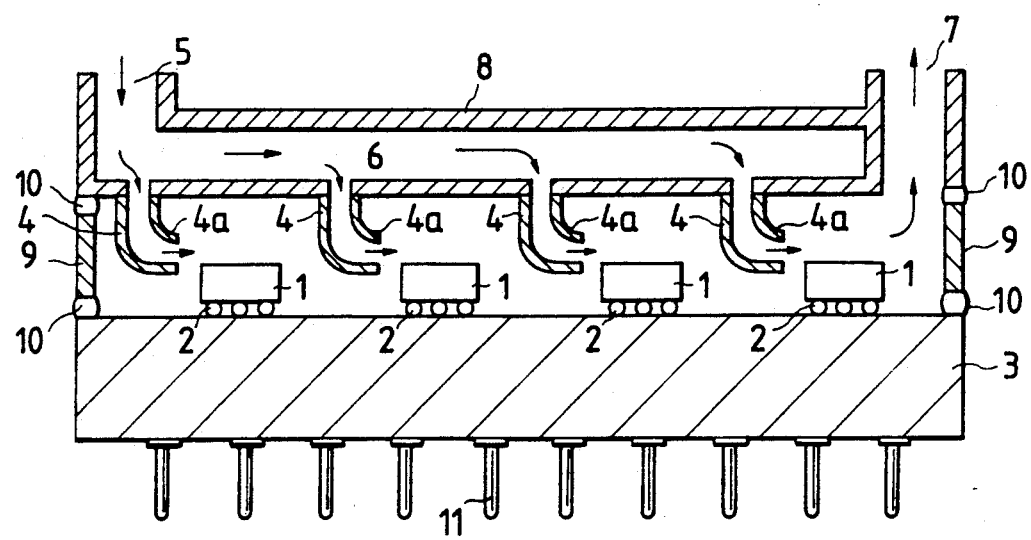
FIG. 1 is a section view of a device according to an embodiment of the present invention.

The chips and a circuit on the module substrate are usually connected together via a number of small solder bumps. When a direct cooling based on the impinging jet is used, the force that accompanies the change in a momentum of the fluid directly acts upon the chips, and load is exerted on the solder bumps developing a problem with regard to reliability in the strength of the solder. When the heat is to be removed in large amounts, in particular, the speed of jet must be increased. However, the load exerted on the solder bumps increases in proportion to the square power of the speed, and the problem becomes more serious with regard to the strength of the solder bumps. Thus, when a chip that generates a large amount of heat is to be cooled by the conventional impinging jet system, there arises a serious problem with regard to temperature distribution in the chip and reliability of strength of the solder bumps for connection to the circuit.

In order to uniformalize the output levels of many circuits mounted in the module and to decrease the noise that stems from temperature difference among the circuits, furthermore, it becomes necessary to confine the temperatures of the chips within a predetermined range. When a plurality of chips having dissimilar functions are arranged in one module, the heat may be generated in greatly different amounts depending upon the chips. In order to confine the temperatures of the chips within a predetermined range even in such a case, therefore, it becomes necessary to change the cooling rate depending upon the amounts of heat generated by the chips.

In a multi-chip module, furthermore, wiring is often made among the repairing pads on the module substrate in order to modify or repair the circuit after the chips are mounted. Jumper wires are used for the wiring that is affected by the wire bonding. When the cooling is affected using a liquid, the force of fluid that acts on the wire connecting portions may cause the wires to be broken, or may give rise to the generation of shearing stress at the junction portions of the wires and the module substrate, or may result in the destruction of junction portions due to recurring stress from vibration of the wires.

To cope with the above-mentioned assignments, according to the present invention, the liquid is directly acted upon the chips or on the chip carrier mounting the chips to affect the forced convection cooling. Therefore, the thermal resistance such as contact thermal resistance which is a cause of decreasing the cooling efficiency is eliminated, and the cooling is affected efficiently. Furthermore, the fluid is allowed to flow substantially in parallel with the back surfaces of the chips so that the heat transfer coefficient is uniformalized on the back surfaces of the chips compared with that of the impinging jet and that the temperature is further uniformalized in the chips, making it possible to improve reliability of the circuit. Moreover, with the fluid flowing in parallel with the back surfaces of the chips, the force of fluid acting upon the connecting solder can be greatly decreased, and reliability can be improved with respect to the strength of the solder. It is further made possible to decrease the force of fluid that acts upon the jumper wires on the module substrate, and the wires are prevented from being cut.

According to the present invention in which the fluid acts upon the individual chips, furthermore, it becomes possible to control the temperature with the chip as a unit, and the temperatures of the chips arranged in the modules can be uniformalized contributing to improving reliability of the semiconductor integrated circuit.

As shown in FIG. 1 according to the present invention, a plurality of chips 1 forming semiconductor circuits are mounted via small solder bumps 2 on a module substrate 3 made of a ceramic or the like. The solder bumps 2 work electrically connect the circuits on the chips 1 to the circuit on the module substrate 3 and maintain mechanical strength for securing the chips onto the module substrate 3. There are many IO pins 11 on the lower surface of the module substrate 3 in order to electrically and mechanically connect the module substrate 3 to a printed wiring board (not shown). The plurality of chips 1 on the module substrate 3 are sealed by a sealing member which is constituted by a module sealing cap 8 and a side wall sealing plate 9, and the interior of the sealing member is filled with a cooling liquid. The sealing cap 8 and the side wall sealing plate 9 are joined by soldering 10 or the like. The cooling liquid is supplied from an inlet port 5 to a header 6 provided in the module sealing cap 8, and is distributed to liquid supplying means 4 that are so provided as to individually cool the chips. After having cooled the chips 1, the cooling liquid is discharged out of the module sealing cap 8 through an outlet port (cooling liquid discharge port) 7. The liquid supplying means 4 are provided with a liquid injection port 4a for injecting the cooling liquid in a direction substantially in parallel with the back surfaces of the chips, with the liquid injection port 4a having nearly the same width as the chip to efficiently cool the chip.

Figure 2:
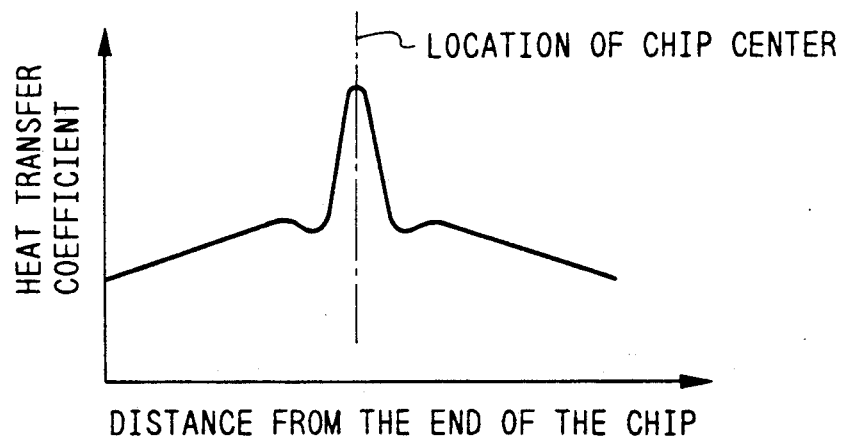
FIG. 2 is a diagram showing a heat transfer distribution according to the impinging jet cooling.
Figure 3:
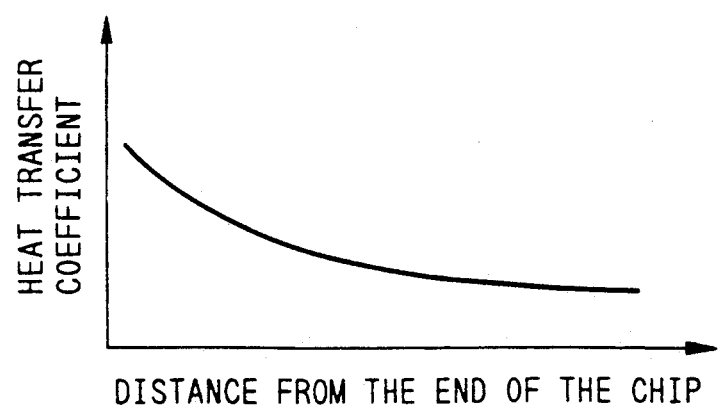
FIG. 3 is a diagram showing a heat transfer distribution according to the present invention.

According to the above-mentioned impinging jet cooling system, a high heat transfer region is formed at the center of impinging of jet. FIG. 2 shows a distribution of heat transfer coefficients on the back surface of the chip of when the impinging jet is used, from which it is recognized that a high heat transfer coefficient is obtained at the center of the chip. When the fluid flows in parallel with the back surface of the chip the heat transfer coefficient varies nearly in reverse proportion to the square root of a distance from the end of the chip. FIG. 3 shows a distribution of heat transfer coefficients of such a case, from which it will be understood that the heat transfer coefficients are more uniform than those of FIG. 2. That is, the temperature in the chip becomes more uniform in the latter case, and the chip is cooled more desirably.

The cooling liquid must have electrically insulating property as it comes into direct contact with the chips 1 and with the circuit on the module substrate 3. Furthermore, the cooling liquid should not cause the material constituting the module sealing cap 8 to be corroded, and must further remain stable chemically. Well-known examples of the cooling liquid include organic cooling media such as Freon (registered trademark of Du Pont Co.) and "Fluorinert" (registered trademark of 3M Co.). The cooling liquid injected from the liquid injection port 4a of the liquid supplying means 4 passes over the upper surface of the chip 1 to remove the heat from the chip.

FIG. 4 shows a concrete example of the liquid supplying means 4 shown in FIG. 1 and in which the liquid injection port (cooling liquid injection port) 4a is arranged in parallel with the back surface 42 of the chip. Being arranged in this way, the liquid that is injected is permitted to flow substantially in parallel with the back surface of the chip. In FIG. 4, if the surface of the liquid injection port 4a of the side close to the chip is positioned at a place close to the module substrate which is under the back surface of the chip, then a recirculation zone 43 develops on the upstream side of the chip as shown in FIG. 5, whereby the pressure loss increases, the liquid flows at a reduced rate over the back surface of the chip to cool it, and the cooling efficiency decreases. In order to avoid such a condition, the surface 41b of the liquid injection port 4a of the side close to the chip must be positioned at a place at least in flush with the back surface 42 of the chip or must be positioned on the opposite side of the module substrate with respect to the back surface of the chip.

Figure 6:
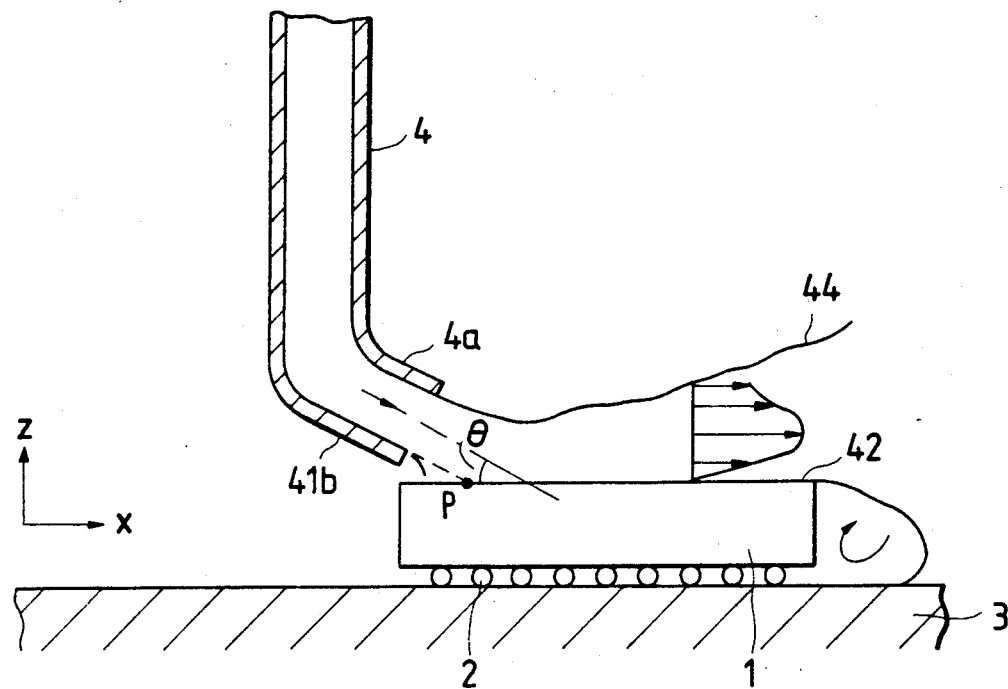
FIGS. 6, 7 and 8 are section views showing other examples of the liquid supplying means shown in FIG. 1.

FIG. 6 shows an example in which the liquid supplying means 4 is so constituted that the outlet path 41 of the liquid injection port 4a is tilted with respect to the back surface of the chip so that the fluid that is injected passes all over the back surface of the chip. In order for the jet to flow over the back surface of the chip, the plane of the liquid injection port 4a inclusive of a surface closest to the chip should intersect the back surface 42 of the chip. Symbol P in FIG. 6 denotes such an intersecting point. The inclination $\theta$ of flow path at the outlet port is defined by an angle subtended by a center axis on the cross section of flow path and the back surface of the chip. Further, if the flow velocity is denoted by V, the density by $\rho$, and the sectional area of the flow path by A, then the force F which is received by the chip is roughly given by $F = \rho A V^2 \sin \theta$. On the other hand, if the allowable load for the solder bumps is denoted by W, then $F \leq W$, and $\sin \theta \leq W/(\rho A V^2)$ must be satisfied. If practical values V, A and W are taken into consideration, it is found that the inclination $\theta$ of flow path at the outlet port should be $0 < \theta \leq 35°$.

Figure 7:
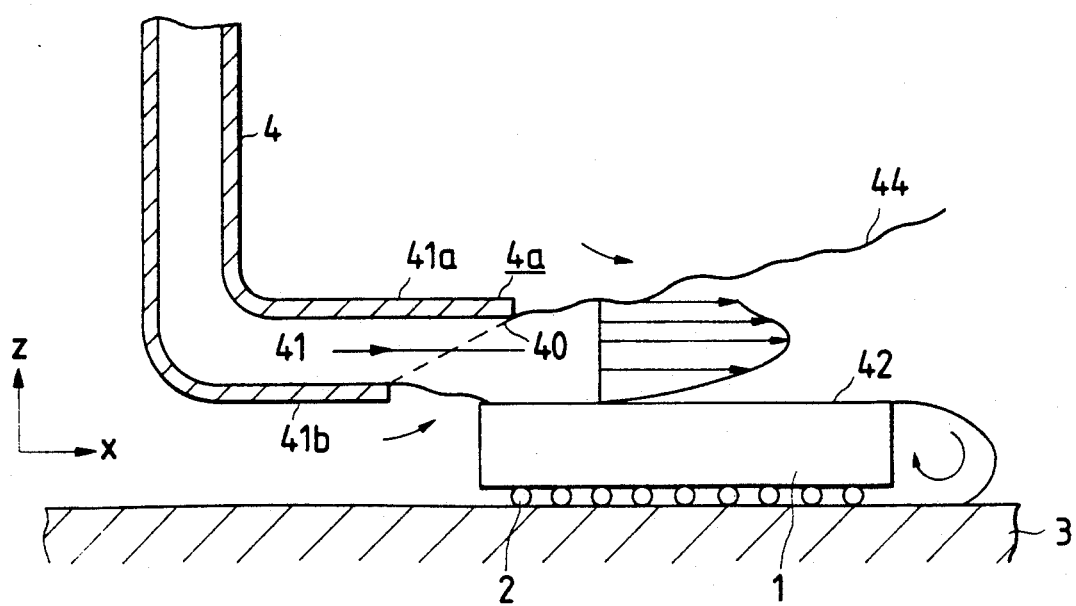
Figure 8:
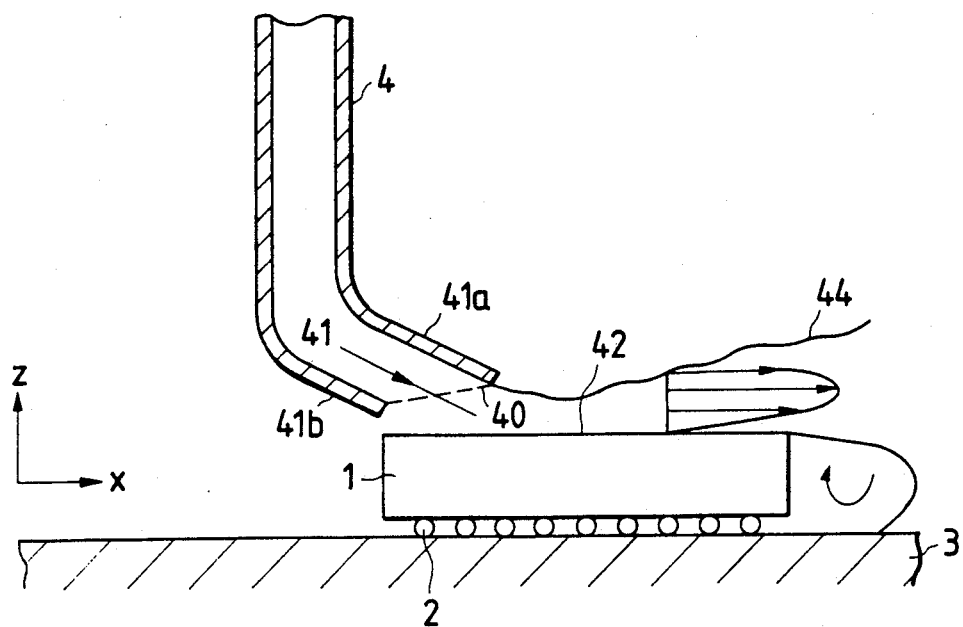

The greater the velocity gradient of flow dV/dz on the back surface of the chip, the greater the heat transfer coefficient, which is advantageous for affecting the cooling, where z denotes a direction perpendicular to the back surface of the chip. The velocity distribution of jet injected from the liquid supplying means is flattened as it goes toward the downstream, and the heat transfer coefficient decreases, too. In order to prevent the heat transfer coefficient, therefore, the end 40 of outlet of the liquid injection port 4a is tilted with respect to the flow path 41 as shown in FIG. 7, such that the wall 41a of flow path of the side remote from the chip becomes longer than the wall 41b of the side close to the chip. Then, development of a main flow boundary 44 of jet is retarded and uniformity of the speed distribution is reduced. FIG. 8 shows an embodiment in which the same means is employed for the case where the flow path 41 is tilted relative to the chip.

Figure 9:
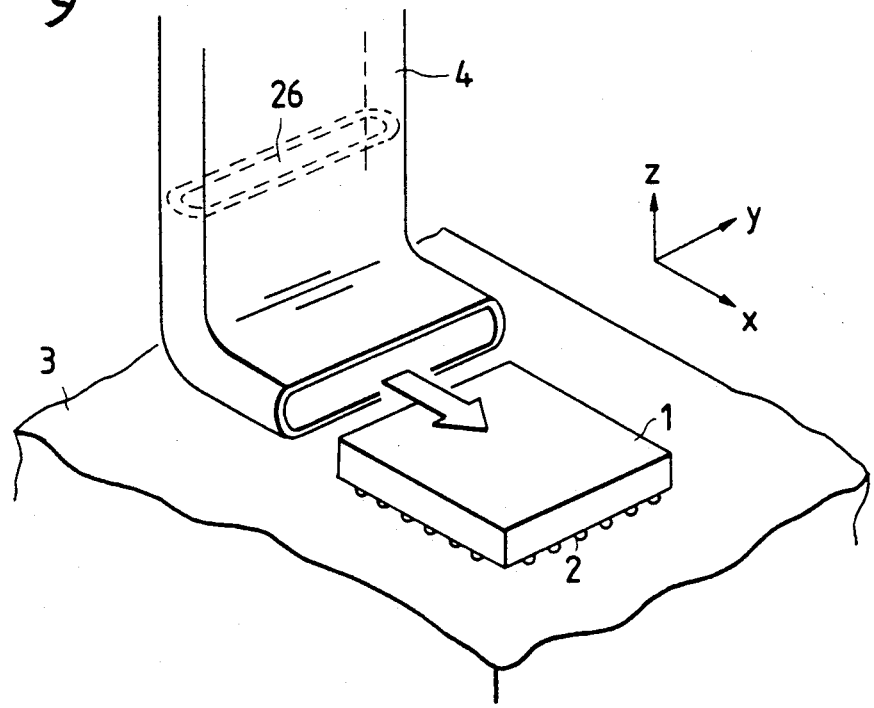
FIG. 9 is a perspective view illustrating in detail the structure of the liquid supplying means shown in FIG. 1.

FIG. 9 shows an embodiment related to the liquid supplying means 4 shown in FIG. 1, and in which the flow path 26 has nearly a rectangular shape in cross section. Therefore, the velocity distribution is little dependent upon the lateral direction y of flow, which is favorable for affecting the cooling. To obtain similar effects, furthermore, the cross section 26 may have an oval shape.

Figure 10:
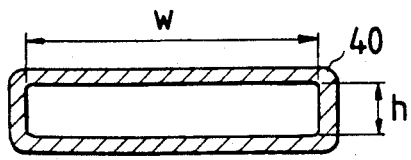
FIG. 10 is a section view showing the shape of an outlet end of a liquid injection port.

FIG. 10 shows the shape 40 of end at the outlet of the liquid injection port 4a. If the cross section of the outlet has a height h and a width w, the practical range of aspect ratio h/w of cross section is determined from the required flow velocity, flow rate and pressure loss while the liquid is being supplied. Further, the height h is related to the speed distribution of flow and must be studied even from this point of view. A study of these quantities and flowability of the surrounding fluid indicates that a practical range of h/w be $0.1 \leq h/w \leq 1.0$.

Figure 11:
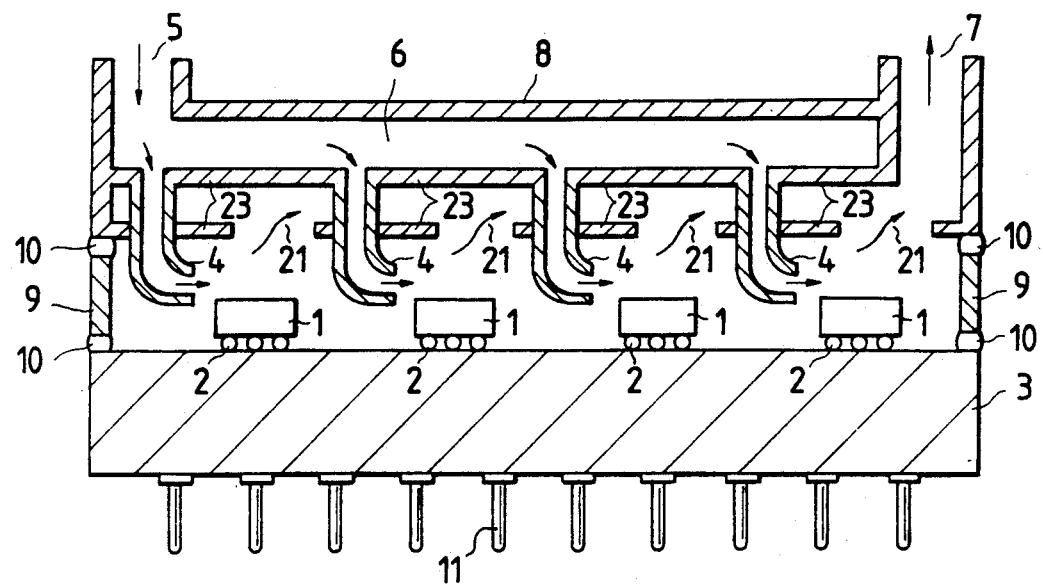
FIG. 11 is a section view showing a modified example of when the device of the present invention is provided with a flow path wall.

FIG. 11 illustrates a modified example in which the device of the present invention shown in FIG. 1 is provided with a flow path wall 23, and in which a discharge port 21 is provided for each of the chips to discharge the cooling liquid after having cooled the chips. Therefore, most of the cooling fluid whose temperature is raised after having cooled the chips is readily guided from the discharge ports 21 to the cooling fluid discharge path 22, and is discharged through a discharge port. Therefore, the cooling liquid does not affect the temperature of other cooling liquid supplied from other liquid supplying means 4, enabling the cooling liquid to be maintained at a uniform temperature. The embodiment of FIG. 11 is very effective for uniformalizing the chip temperature in the case when the power of the chips changes conspicuously with the lapse of time. That is, the temperature of the liquid changes with the lapse of time after it has cooled the chips whose power changes conspicuously with time. When the liquid is mixed with the liquid that cools other chips, the temperature of the cooling liquid undergoes the change and the cooling performance changes. Furthermore, when it is required to control the temperature more strictly, the liquid supplying means 4 and the flow path wall 23 of the exhaust flow paths 22 may be made of a material having a low thermal conduction. Moreover, the layer of a material having a low thermal conductivity may be added to the surface of at least any one of the header (cooling liquid introducing path) 6, exhaust flow path 22 or the liquid supplying means 4, or the layer of a material having a low thermal conductivity may be inserted inside the flow path wall 23. Such a layer consists of coating, for example, a high molecular film or forming a metal oxide film on the surface. Then, the cooling liquid that flows through the path 6 and the liquid supplying means 4, prior to being heated, is not heated by the liquid that flows through the flow path 22 after being heated.

Figure 12:
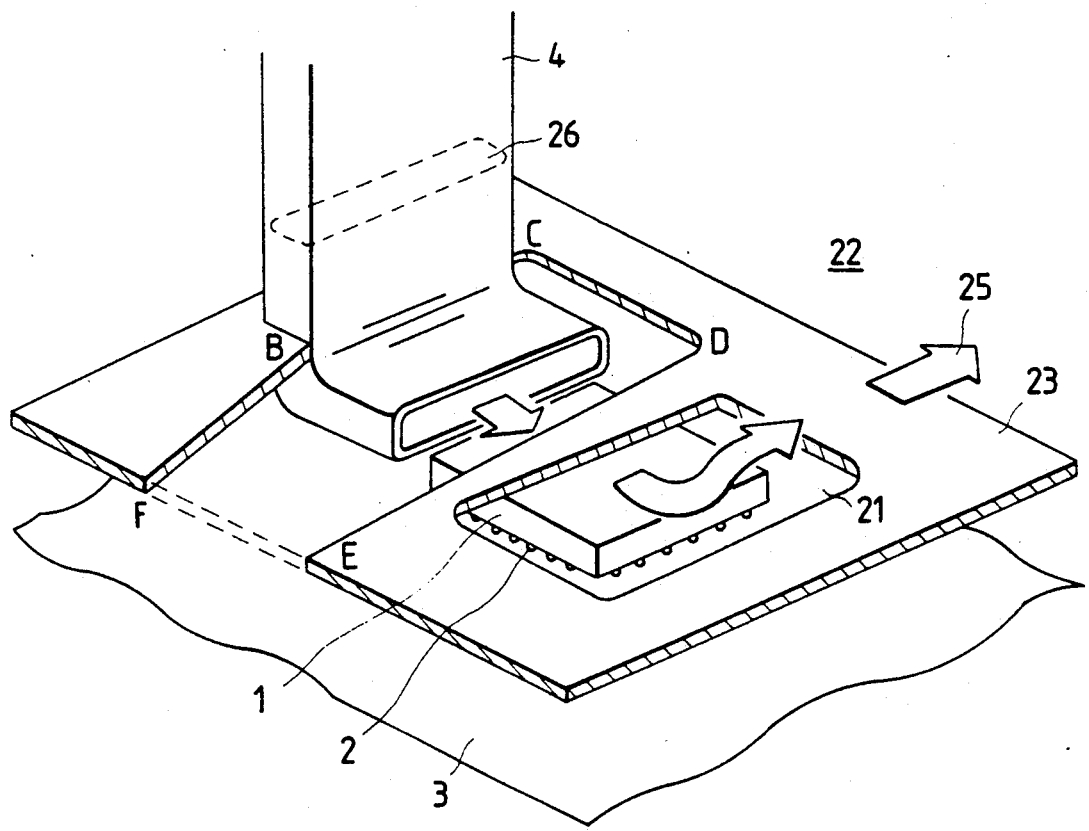
FIG. 12 is a perspective view showing on an enlarged scale a chip cooling portion of FIG. 11.

As shown in FIG. 12 the liquid supplying means 4 has a nearly rectangular shape in cross section, and the direction 25 of fluid flowing through the exhaust flow path 22 is the lengthwise direction of the liquid supplying means, in order to decrease the pressure loss in the flow path 22. In FIG. 12, part of the flow path wall 23 is cut away from the flow path wall 23 as indicated by F-B-C-D-E such that the outlet port of the liquid supplying means can be easily understood.

Figure 13:
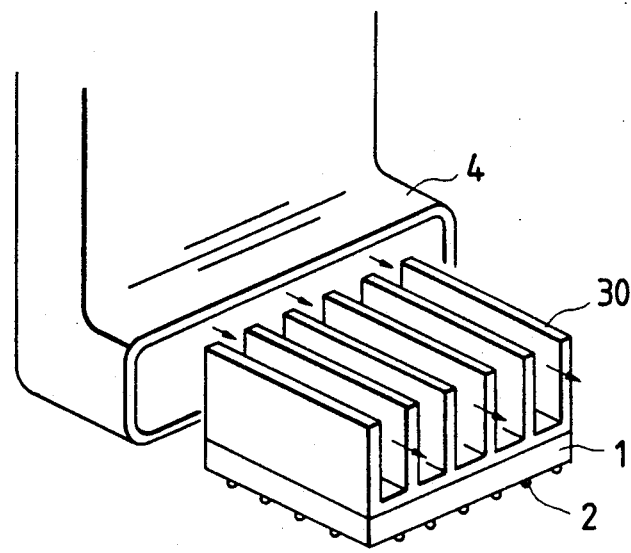
FIGS. 13, 14 and 15 are perspective views of when an integrated circuit is provided with fins in the device of the present invention.

FIG. 13 shows an example in which the cooling fins are mounted on the back surface of the chip. The fins 30 are made of a metal having a high thermal conductivity such as copper or aluminum, or are made of a ceramic material such as silicon carbide. To join the fin 30 to the chip 1, a metallized layer is formed on the chip surface and, then, the fins are joined by soldering or the like.

Figure 14:
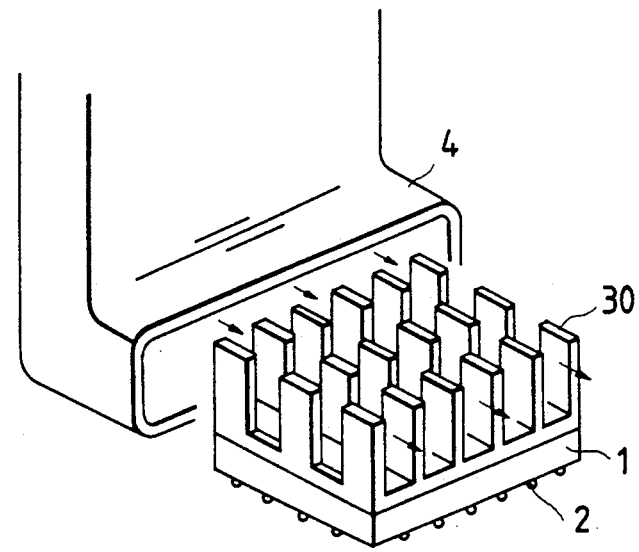
Figure 15:
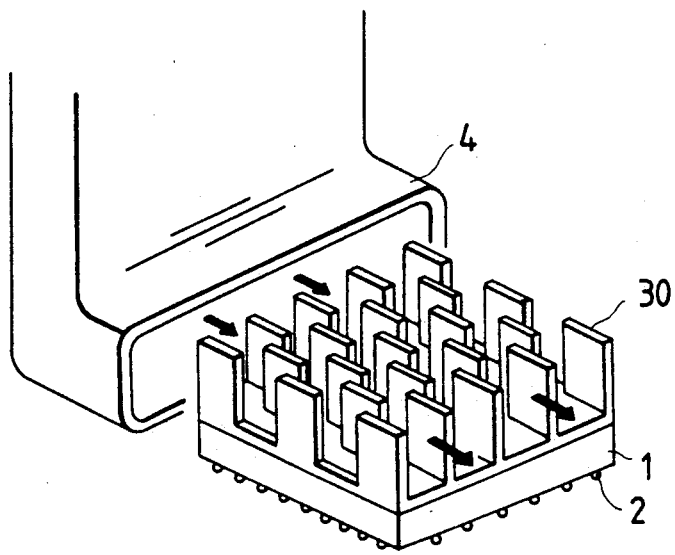

FIGS. 14 and 15 shows arrangements of fins to enhance the cooling performance of the fins 30 in the example of FIG. 13. In FIG. 14, the fins 30 are divided in the direction of flow. At the leading edges of the fins, a high heat transfer coefficient is exhibited since the thermal boundary layer is thin. With the fins being arranged as described above, a high cooling performance is obtained. In FIG. 15, the divided fins 30 are arranged in a staggered manner. In this case, the effect of temperature rise of the fluid caused by the fins of the upstream side is offset, and the cooling performance is further enhanced.

Figure 16:
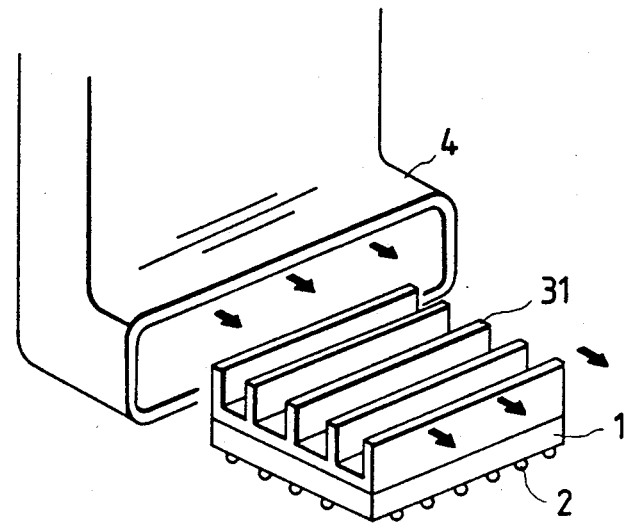
FIGS. 16 and 17 are perspective views of when the integrated circuit is provided with cooling plates.
Figure 17:
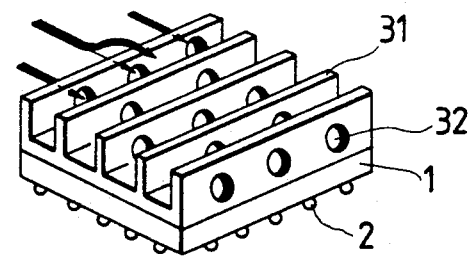

FIG. 16 shows an example in which the cooling plates are arranged on the back surface of the chip in a direction at right angles with the flow. The flow comes into collision with the cooling plate undergoing separation and reattachment to form a turbulence. As the flow becomes turbulent, the heat transfer is enhanced greatly which is desirable for cooling the chips. FIG. 17 shows an example in which holes 32 are formed in the cooling plates 31. Part of the flow impinging upon the cooling plates passes over the cooling plates, and another part flows through the holes 32 and impinges upon the cooling plate 31 of the downstream side to form a high heat transfer area. That is, in this constitution, the flow becomes turbulent and more heat is transferred owing to impinging jet, making it possible to obtain a high cooling performance which is favorable for cooling the chips. In order to promote the turbulence, furthermore, the back surface of the chip may be coarsened such as making the back surface of the chip rugged or placing wires on the back surface of the chip so that the flow of stream becomes unstable.

When the chip 1 is provided with fins 30 or cooling plates 31 as described above, the size, shape or number of the fins or the cooling plates may be changed to give various heat transfer characteristics to the chips. That is, even when the chips do not generate the same amount of heat and the heat must be removed by different amounts for each of the chips, the above-mentioned method makes it possible to impart proper heat transfer characteristics to each of the chips by means of cooling plates, so that the temperature in the chip circuits is uniformalized. This method is very effective when the chips that generate heat in different amounts are to be mounted in one module.

Though the foregoing examples have dealt with the cases where the chips are cooled by the forced convection, it is also allowable to select a cooling liquid that has a suitable boiling point so that it boils on the surface of the chip while it undergoes convection in a forced manner. In order to improve heat transfer performance by boiling, there has been proposed a method according to which a porous stud having a number of small holes are provided on the back surface of the chip as disclosed in, for example, Japanese Patent Laid-Open No. 229353/1985. Therefore, the porous stud may be provided instead of the fins or cooling plates shown in FIGS. 13 and 16.

Figure 18:
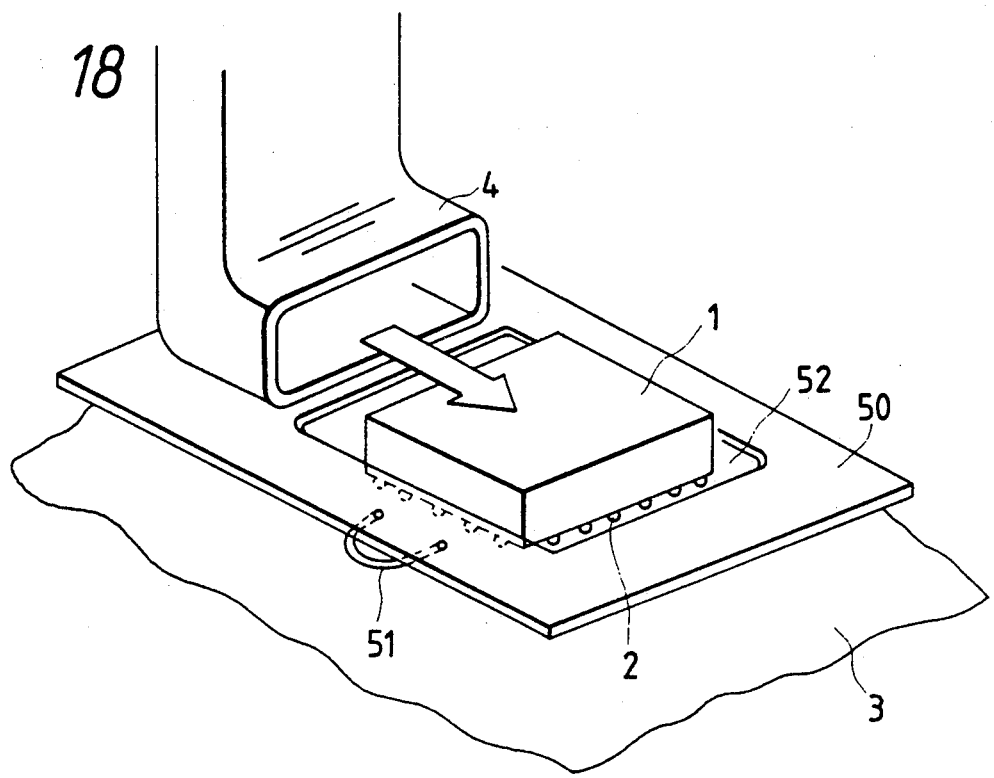
FIG. 18 is a perspective view of when there is used a flow covering plate for protecting the jumper wires on the module substrate.

FIG. 18 illustrates an embodiment of the present invention in which a covering plate 50 is installed which prevents the force of fluid from acting directly upon a jumper wire 51 that is connected to the module substrate 3. The covering plate 50 is provided with a hole 52 so that the chip 1 is fitted therein. The covering plate 50 may be formed together with the liquid supplying means 4 as a unitary structure or may be directly mounted on the module substrate 3 by soldering or the like.

In preparing a module, the flow path 6 that serves as a header and, if necessary, the exhaust flow path 22 are provided with the liquid supplying means 4, so that the whole structure serves as a module cap which can be joined onto the module substrate on which the chips are mounted. To join them together, use is made of, for example, a side wall sealing plate for sealing the side surfaces of the module and, then, the cap, the side wall sealing plate and the module substrate are secured together by soldering.

Figure 19:
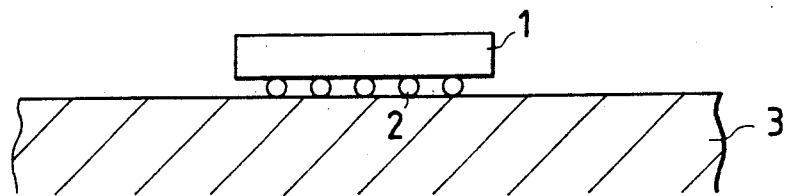
FIGS. 19, 20 and 21 are diagrams showing chips to be mounted on the module substrate.
Figure 20:
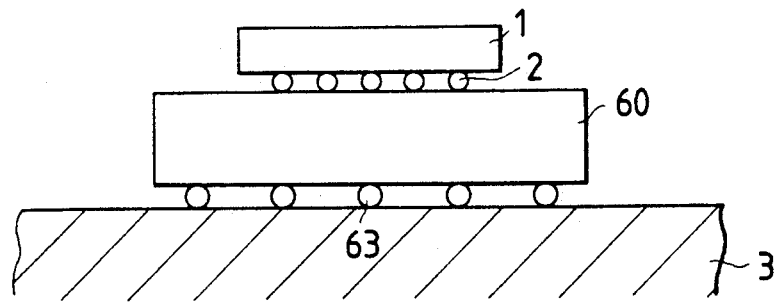
Figure 21:
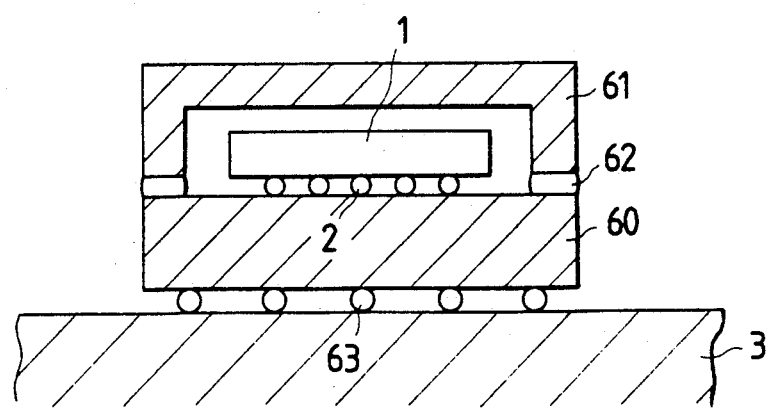

In a large computer, the chip forming an integrated circuit is in many cases mounted on the module substrate 3 directly as shown in FIG. 19 or being placed on a chip carrier 60 as shown in FIGS. 20 and 21. As is well known, the chip carrier 60 connects the wirings from the integrated circuit on the chip to each other or extends the wirings. The chip carrier 60 may be so constructed that the chip is exposed as shown in FIG. 20 or that the chip is sealed with a cap 61 that seals the chip as shown in FIG. 21. The foregoing embodiments have dealt with the cases where the chip 1 was mounted directly on the module substrate 3. However, the same effects are also obtained even when the invention is adapted to the module mounting a chip carrier having a structure, as shown in FIG. 20 or 21 instead of mounting the chip.

According to the present invention, an integrated circuit that generates a large amount of heat can be cooled efficiently. Moreover, the temperature in the integrated circuit can be uniformalized. The force of fluid acting on the solder bumps for connection can be greatly reduced, and the force of fluid acting on the jumper wires on the module substrate can be reduced, too, making it possible to improve reliability in the strength of solder bumps and wires. According to the present invention, furthermore, it is allowed to change the cooling performance for each of the integrated circuits and, hence, to uniformalize the temperature in many integrated circuits mounted on the module. Furthermore, the rise in temperature of the cooling fluid that has cooled one integrated circuit does not affect other integrated circuit, and the thermal control is carried out highly precisely for the integrated circuits. Since the thermal control is carried out to a high degree as described above, it is made possible to improve reliability of a number of semiconductor integrated circuits mounted on the module.

What is claimed is:

1. A semiconductor cooling device comprising:
   a plurality of semiconductor integrated circuits mounted on a module substrate;
   a sealing member attached to said module substrate and forming a housing enclosing said plurality of integrated circuits; and
   liquid supplying means provided on said sealing member and having a plurality of cooling liquid nozzles respectively associated with each of said individual integrated circuits, wherein said liquid nozzles emit and direct jets of a cooling liquid in a direction substantially in parallel with a back wall surface of the individual integrated circuits.

2. A semiconductor cooling device according to claim 1, wherein outlet surfaces of the cooling liquid nozzles are parallel with the back wall surfaces of the integrated circuits.

3. A semiconductor cooling device according to claim 2, wherein said cooling liquid nozzles each include a surface positioned substantially at a same level with the back wall surfaces of the integrated circuits.

4. A semiconductor cooling device according to claim 2, wherein an outlet side end of each of the cooling liquid nozzles is tilted relative to a direction in which the cooling liquid is emitted.

5. A semiconductor cooling device according to claim 1, wherein each of the cooling liquid nozzles of said liquid supplying means has a nearly rectangular shape.

6. A semiconductor cooling device according to claim 5, wherein each of the cooling liquid nozzles have a ratio h/w of a height h of a cross-section of the nozzle to a width w of the cross-section of the nozzle over a range of $0.1 \leq h/w \leq 1.0$.

7. A semiconductor cooling device according to claim 1, wherein each of the integrated circuits is provided with cooling fins.

8. A semiconductor cooling device according to claim 7, wherein the cooling fins are split in a direction of flow of the cooling liquid.

9. A semiconductor cooling device according to claim 1, wherein each of the integrated circuits is provided with cooling plates at right angles with respect to a direction of flow of the cooling liquid.

10. A semiconductor cooling device according to claim 9, wherein the cooling plates are perforated.

11. A semiconductor cooling device according to claim 7, wherein a size, shape and number of the cooling fins are determined in dependence upon an amount of heat generated by each of the integrated chips.

12. A semiconductor cooling device according to claim 1, wherein said module substrate includes jumper wire means for enabling at least one of a repair and modification of the integrated circuits, and wherein a covering plate is placed in the flow direction of the cooling liquid between the cooling liquid nozzles and the jumper wires.

13. A semiconductor cooling device comprising:
   a plurality of semiconductor integrated circuits mounted on a module substrate;
   a sealing member attached to said module substrate and forming a housing enclosing said plurality of integrated circuits; and
   liquid supplying means provided on said sealing member and having a plurality of cooling liquid nozzles respectively associated with each of said individual integrated circuits, wherein said cooling liquid nozzles emit and direct cooling liquid jets at a slant to back wall surface of the individual integrated circuits.

14. A semiconductor cooling device according to claim 13, wherein an angle $\theta$ subtended by a center axis of a cross section of each cooling liquid nozzles and the back wall surface of each of the integrated circuits is determined in accordance with the following relationship:

$$\theta \leq \arcsin(W/[\rho A V^2]),$$

where:
- W = an allowable load for solder bumps connecting the respective integrated circuits to the module substrate,
- $\rho$ = a density of the cooling liquid,
- V = a velocity of the cooling liquid, and
- A = a cross-sectional area of the respective cooling liquid injection nozzle.

15. A semiconductor cooling device according to claim 14, wherein each angle $\theta$ lies over a range of $0 < \theta \leq 35°$.

16. A semiconductor cooling device comprising:
a plurality of semiconductor integrated circuits mounted on a module substrate;
a sealing member attached to said module substrate and forming a housing enclosing said plurality of integrated circuits;
cooling liquid supplying means provided on said sealing member and having a plurality of cooling liquid nozzles respectively associated with each of said integrated circuits, said cooling liquid nozzles emitting and directing jets of cooling liquid in a direction substantially parallel to a back wall surface of the respective integrated circuits;
a cooling liquid introducing path provided on said sealing member to introduce the cooling liquid to be supplied to said cooling liquid nozzles; and
a cooling liquid discharge path provided independently of said cooling liquid introducing path to guide the cooling liquid after having cooled the integrated circuits to an exterior of said housing.

17. A semiconductor cooling device according to claim 16, wherein said cooling liquid discharge path is provided in a direction in which the cooling liquid is introduced.

18. A semiconductor cooling device according to claim 16, wherein a partitioning wall separates the cooling liquid introducing path from the cooling liquid discharge path and is made of a material having a low thermal conductivity.

19. A semiconductor cooling device comprising:
a plurality of semiconductor integrated circuits mounted on a module substrate;
a sealing cap connected to said module substrate and sealing the plurality of integrated circuits from the exterior of the device;
a plenum between said sealing cap and said module substrate;
a cooling liquid accommodated in said plenum;
a header formed in said cap to guide the cooling liquid;
cooling liquid supplying means including a plurality of cooling liquid nozzles which directly emit the cooling liquid to each of said integrated circuits, each of said cooling liquid nozzles emitting and directing a jet of the cooling liquid in a direction substantially in parallel with a back wall surface of the individual integrated circuits; and
a cooling liquid discharge port for discharging the cooling liquid to the exterior of the device after the liquid cooling passes said cap to cool the integrated circuits;
wherein said cooling liquid supplying means has liquid nozzles for emitting the cooling liquid in parallel with the back surface of each of the integrated circuits.

20. A semiconductor cooling device according to claim 19, wherein the cooling liquid nozzles have a width nearly the same as a width of the integrated circuits.

21. A semiconductor cooling device according to claim 19, wherein each of the integrated circuits includes a chip carrier securely connected to the module substrate, a semiconductor integrated circuit chip securely connected to the chip carrier, and a chip carrier-sealing cap for sealing the chip to the chip carrier.

* * * * *